US010037992B1

(12) United States Patent
Wu et al.

(10) Patent No.: US 10,037,992 B1
(45) Date of Patent: Jul. 31, 2018

(54) METHODS AND APPARATUSES FOR OPTIMIZING POWER AND FUNCTIONALITY IN TRANSISTORS

(71) Applicant: Altera Corporation, San Jose, CA (US)

(72) Inventors: Zhiyuan Wu, San Jose, CA (US); Ning Cheng, San Jose, CA (US); Christopher J. Pass, San Jose, CA (US)

(73) Assignee: Altera Corporation, San Jose, CA (US)

( * ) Notice: Subject to any disclaimer, the term of this patent is extended or adjusted under 35 U.S.C. 154(b) by 232 days.

(21) Appl. No.: 14/579,831

(22) Filed: Dec. 22, 2014

(51) Int. Cl.
| | |
|---|---|
| *H01L 27/088* | (2006.01) |
| *H01L 21/8234* | (2006.01) |
| *H01L 29/06* | (2006.01) |
| *H01L 21/033* | (2006.01) |

(52) U.S. Cl.
CPC ...... *H01L 27/0886* (2013.01); *H01L 21/0334* (2013.01); *H01L 21/823431* (2013.01); *H01L 29/0653* (2013.01)

(58) Field of Classification Search
CPC ......... H01L 27/10826; H01L 27/10879; H01L 27/1211; H01L 27/0886
See application file for complete search history.

(56) References Cited

U.S. PATENT DOCUMENTS

| | | | |
|---|---|---|---|
| 4,023,195 A * | 5/1977 | Richman | H01L 29/0653 148/DIG. 117 |
| 6,413,802 B1 | 7/2002 | Hu et al. | |
| 7,732,874 B2 | 6/2010 | Zhu et al. | |
| 8,105,885 B1 | 1/2012 | Lee et al. | |
| 8,174,073 B2 | 5/2012 | Lee et al. | |
| 8,445,334 B1 | 5/2013 | Basker et al. | |
| 8,637,359 B2 | 1/2014 | Chang et al. | |
| 8,723,262 B2 | 5/2014 | Basker et al. | |
| 9,293,459 B1 * | 3/2016 | Cheng | H01L 27/0886 |
| 2013/0119482 A1 * | 5/2013 | Wann | H01L 29/66818 257/401 |
| 2013/0157451 A1 | 6/2013 | Lin et al. | |

OTHER PUBLICATIONS

Pass et al. U.S. Appl. No. 13/924,143, filed Jun. 21, 2013.

* cited by examiner

*Primary Examiner* — Mohammad Choudhry
(74) *Attorney, Agent, or Firm* — Tianyi He

(57) ABSTRACT

A transistor device is provided. The transistor device includes a group of fins formed in a substrate, where the group of fins comprises at least one enabled fin and at least one disabled fin. Each of the fins has first and second fin portions. The first fin portion encompasses a drain region and the second fin portion of the fins encompasses a source region. These two regions are separated by a channel region. A gate structure is formed over the fins and channel region and in between the first fin portion and the second fin portion of the fins. The transistor device further includes a conductive structure. The conductive structure shorts the first fin portion of the at least one disabled fin to the second fin portion of the at least one disabled fin.

20 Claims, 7 Drawing Sheets

METHODS AND APPARATUSES FOR OPTIMIZING POWER AND FUNCTIONALITY IN TRANSISTORS

BACKGROUND

As demands for higher speed and higher density integrated circuit devices grow, smaller transistors are created. One recent advance in transistor technology is the introduction of fin-type field effect transistors (finFETs). FinFET devices are generally characterized by a vertical fin-shaped channel and are typically formed on silicon-on-insulator (SOI) or bulk silicon substrates.

In general, the drive current finFET device is directly proportional to the number of fins. In some cases, the drive current of the finFET device is modulated, which can be used for the purpose of configuring functions of corresponding circuits in the finFET device. For example, one or more fins in the finFET device may be selected to adjust (e.g., increase or decrease) the drive current of finFET device. A conventional drive current modulation technique utilizes the use of multiple masks to select one or more fins to modify the drive current. However, such a method is limited by the mask fabrication process, which is typically expensive and requires significant design effort.

SUMMARY

In accordance with the present invention, methods and apparatus for optimizing power and functionality in transistors are provided.

It is appreciated that the present invention can be implemented in numerous ways, such as a process, an apparatus, a system, or a device. Several inventive embodiments of the present invention are described below.

A method for fabricating a transistor structure on a substrate is provided. The method may include forming multiple fins in the substrate, with each fin comprising a first fin portion and a second fin portion. A gate structure is formed over the fins, where the gate structure is formed between the first and second fin portions. Accordingly, a conductive structure is formed to short the first fin portion of at least a given one of the fins to the second fin portion of the at least given one of the fins. The method further includes forming first and second contact segments above the first fin portion of each fin. Both contact segments are separated by a gap. Simultaneously, third and fourth contact segments are formed above the second fin portion of each fin, with both contact segments separated by an additional gap.

Circuitry fabricated on a semiconductor substrate is provided. The circuitry includes a group of fins having first and second fin portions in the semiconductor substrate. A gate structure is disposed over the group of fins and in between the first and second fin portions. The circuitry further includes a first contact segment shorted to at least one of the first fin portions of the group of fins and electrically isolated to at least one other of the first fin portions of the group of fins. Additionally, the circuitry includes a second contact segment shorted to at least one of the second fin portions of the group of fins and electrically isolated to at least one other of the second fin portions of the group of fins.

A transistor device is provided. The transistor device includes a substrate and a group of fins formed on the substrate, where the group of fins includes at least one enabled fin and at least one disabled fin. The transistor device further includes contact segments that are vertically connected to the at least one disabled fin and additional contact segments that are vertically connected to the at least one enabled fin. The additional contact segments are electrically isolated from the contact segments. Lastly, a conductive structure is formed (e.g., using a mask) above the group of fins and that shorts the disabled fin so that the drive current of the transistor device can be modified.

Further features of the invention, its nature and various advantages, will be more apparent from the accompanying drawings and the following detailed description of the preferred embodiments.

DETAILED DESCRIPTION

The embodiments provided herein include methods and apparatus for optimizing power and functionality transistors.

It will be obvious, however, to one skilled in the art, that the present exemplary embodiments may be practiced without some or all of these specific details described with reference to the respective embodiments. In other instances, well-known operations have not been described in detail in order not to unnecessarily obscure the present embodiments.

Figure 1:
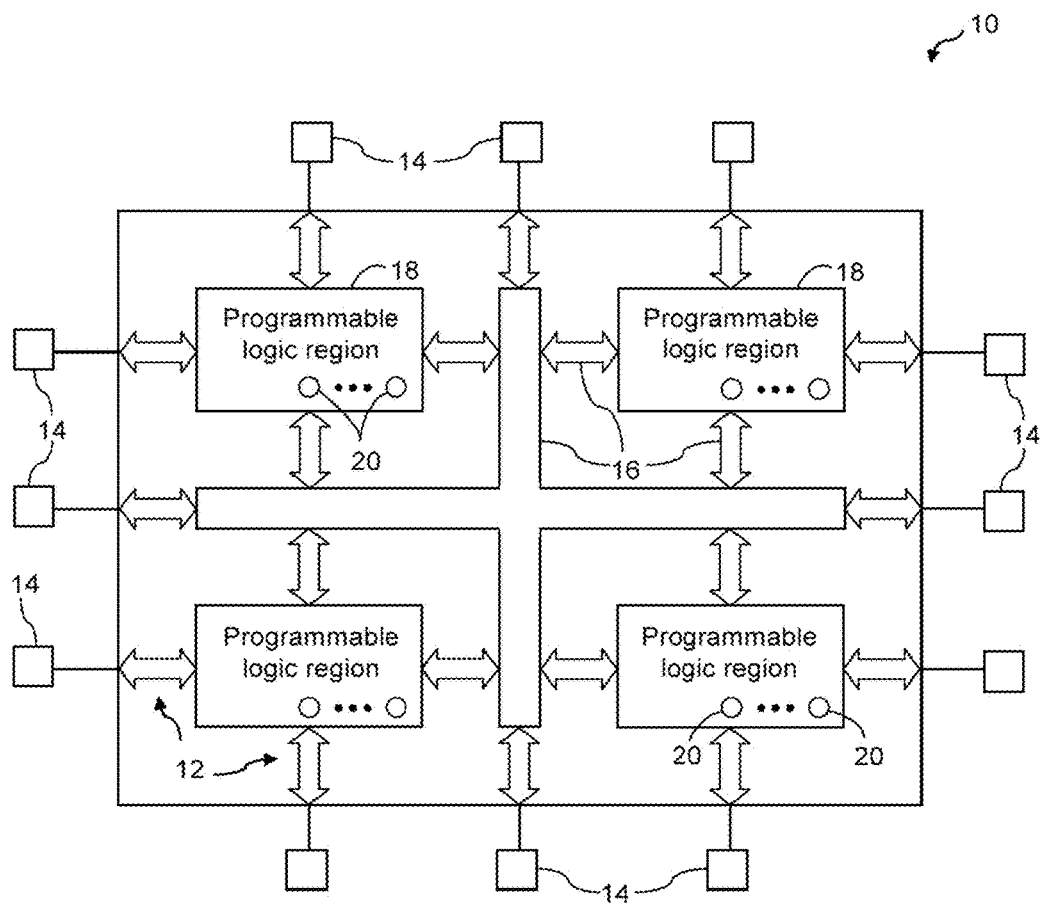
FIG. 1 is a diagram of an illustrative integrated circuit in accordance with an embodiment of the present invention.

FIG. 1 is a diagram of an illustrative integrated circuit 10 in accordance with an embodiment of the present invention. Integrated circuit 10 may have input/output circuitry 12 for driving signals off of integrated circuit 10 and for receiving signals from other circuits or devices via input/output pins 14. Interconnection resources 16 such as global and local vertical and horizontal conductive lines and busses may be used to route signals on integrated circuit 10. Interconnection resources 16 include fixed interconnects (conductive lines) and programmable interconnects (e.g., programmable connections between respective fixed interconnects). The programmable interconnects associated with interconnection resources 16 may be considered to be a part of programmable logic regions 18.

Memory elements 20 may be formed using complementary metal-oxide-semiconductor (CMOS) integrated circuit technology (as an example). In the context of programmable logic device, the memory elements may store configuration data and are therefore sometimes referred to as configuration random-access memory (CRAM) cells. In general, configuration random-access memory elements 20 may be arranged in an array pattern. In a programmable logic device, there may be millions of memory elements 20 on a single device.

A user (e.g., a logic designer) may provide configuration data for the array of memory elements during programming operation. Once loaded with configuration data, memory elements 20 may provide a corresponding static control output signal that selectively controls (e.g., turn on and off) portions of the circuitry in programmable logic regions 18 and thereby customize its functions as desired. As an example, the output signals of memory elements 20 are used to control the gates of transistors.

The circuitry of programmable logic device 10 may be organized using any suitable architecture. For example, programmable logic regions 18 may be organized in a series of rows and columns of larger programmable logic regions each of which contains multiple smaller regions. The larger regions are sometimes referred to as logic array blocks. The smaller logic regions are sometimes referred to as logic elements. A typical logic element may contain a look-up table, registers, and programmable multiplexers. If desired, programmable logic regions 18 may be arranged in more levels or layers in which multiple large regions are interconnected to form still larger portions of logic.

Horizontal and vertical conductors and associated control circuitry may be used to access memory elements 20 when memory elements 20 are arranged in an array. The control circuitry, for example, may be used to clear all or some of the memory elements. The control circuitry may also write data to memory elements 20 and may read data from memory elements 20. Memory elements 20 may be loaded with configuration data, for instance, in CRAM arrays. The loaded configuration data may then be read out from the memory array to confirm proper data capture before integrated circuit 10 is used during normal operation in a system.

As integrated circuit technology advances, continued scaling of semiconductor technology has led to smaller transistor sizes and steadily improved transistor performance. As such, more and more transistors may be included in a single integrated circuit device, such as integrated circuit 10, and improve transistor performance. As further transistor scaling continues, three-dimensional (3D) transistors such as fin-type field effect transistors (finFETs) are manufactured as alternatives to conventional transistors for CMOS integrated circuit devices to reduce leakage current.

Figure 2:
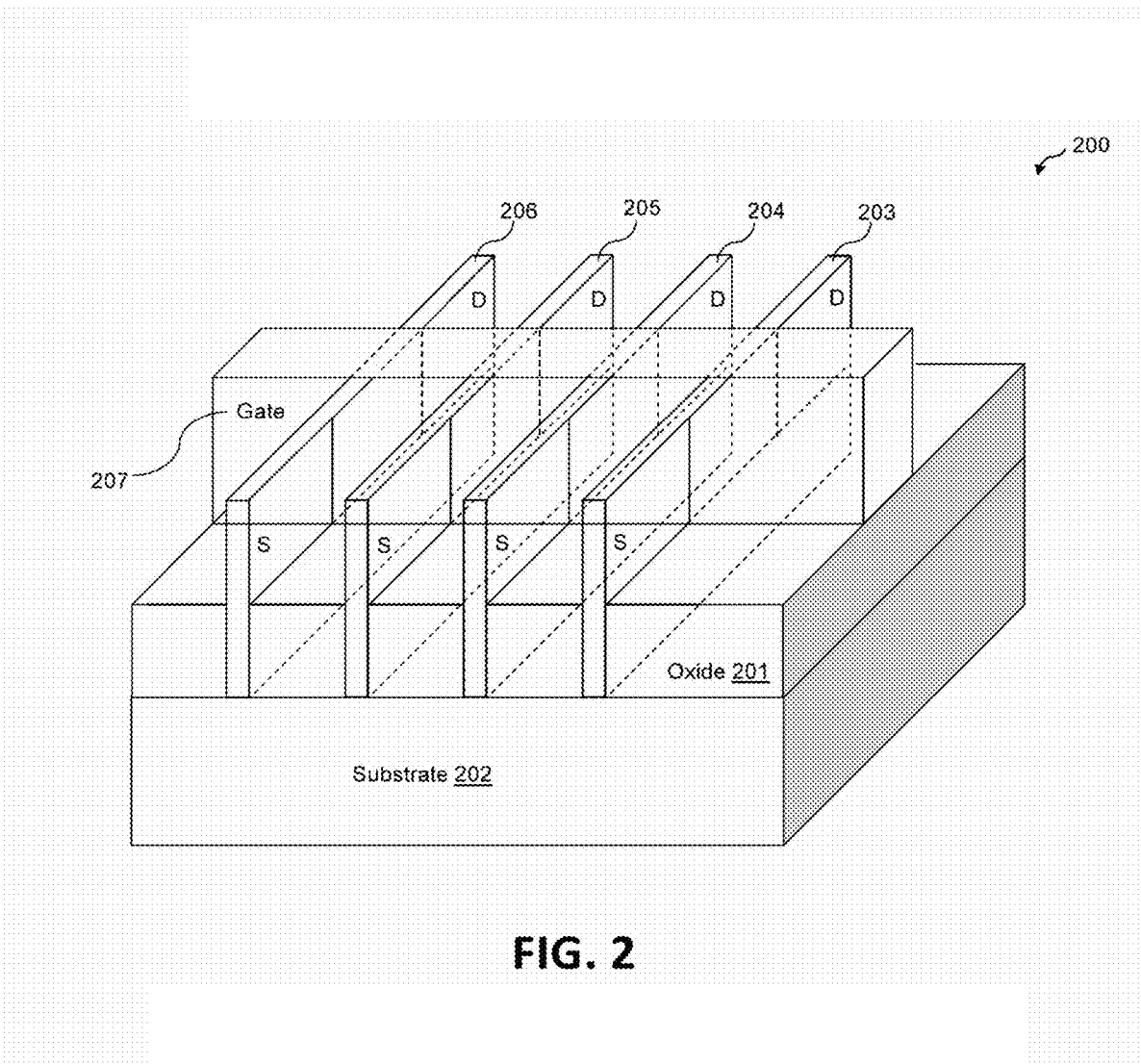
FIG. 2 is an isometric view of an illustrative transistor structure in accordance with an embodiment of the present invention.

FIG. 2 is an isometric view of illustrative transistor structure 200 in accordance with an embodiment of the present invention. It should be appreciated that FIG. 2 shows a general representation of a fin-type field effect transistor (finFET).

As shown in FIG. 2, transistor structure 200 is fabricated over substrate 202. Transistor structure 200 has source and drain regions (denoted by "S" and "D," respectively) and a gate structure 207. The source and drain regions are two highly doped regions, which can be either P or N type. If they are P type, transistor structure 200 is a p-channel metal-oxide-semiconductor (PMOS) transistor; and if they are N type, transistor structure 200 is an n-channel metal-oxide-semiconductor (NMOS) transistor. Gate structure 207 may intersect the channel regions (not shown) of fins 203, 204, 205, and 206. Output signals of memory element 20 of FIG. 1 may be used to control gate structure 207 of transistor structure 200. While not shown in FIG. 2, a gate dielectric may separate the channel region from gate structure 207.

Transistor structure 200 may include multiple fins (e.g., fins 203, 204, 205, and 206), as shown in FIG. 2. Fins 203, 204, 205, and 206 may be formed with a semiconductor material such as silicon. The width of each fin may be, for example, about 10 to 20 nanometer (nm). In one embodiment, fins 203, 204, 205, and 206 are partially formed in an oxide layer (e.g., oxide layer 201) that is formed over substrate 202. Oxide layer 201 may fully isolate the adjacent fins 203, 204, 205, and 206 from each other. In one embodiment, oxide layer 201 may be first deposited, patterned, and etched to form fins 203, 204, 205, and 206. For example, oxide layer 201 may be silicon dioxide layer or silicon nitride layer.

In general, the drive current of a finFET device may be directly proportional to the number of fins. In some cases, the drive current of the finFET device is modulated, which can be used for the purpose of configuring functions of corresponding circuits in the finFET device. For example, one or more fins in the finFET device may be activated (e.g., enabled) or deactivated (e.g., disabled) to adjust (e.g., decrease) the drive current of the finFET device.

Figure 3A:
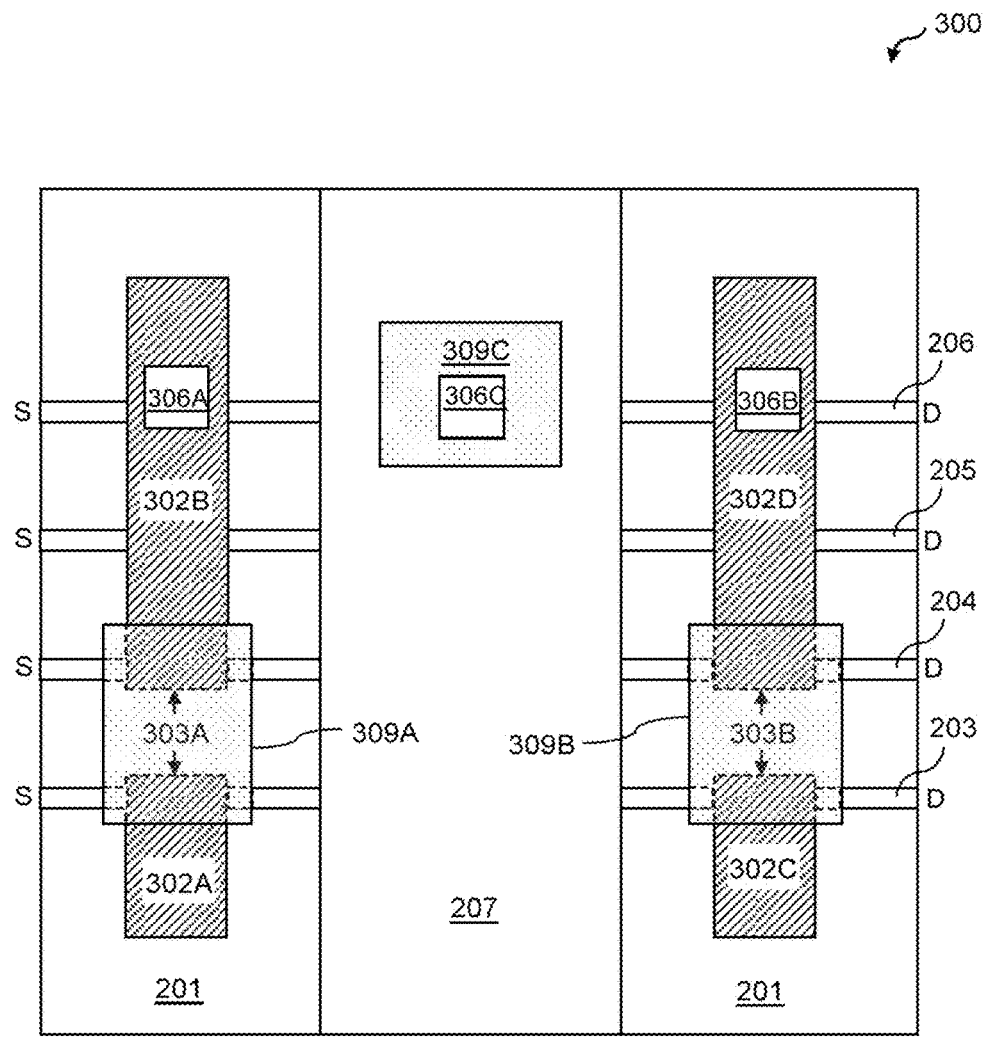
FIG. 3A shows a top view of an illustrative transistor structure having four active fins in accordance with an embodiment of the present invention.

FIG. 3A shows a top view of transistor structure 300 having four active fins (e.g., fins 203, 204, 205, and 206) in accordance with an embodiment of the present invention. It should be appreciated that the general structure of transistor structure 300 may be embodied as transistor structure 200 of FIG. 2, which is described above. As such, for the sake of brevity, elements that have been described above, such as fins 203, 204, 205, and 206, oxide layer 201, and gate structure 207, will not be described in detail.

Contact segments 302A, 302B, 302C, and 302D may be used to electrically connect the source denoted by "S") and drain regions (denoted by "D") of fins 203, 204, 205, and 206 to other metal layers or transistors (not shown) through conductive vias 306A and 306B. As shown in FIG. 3A, contact segments 302A, 302B, 302C, and 302D are formed and vertically connected to fins 203, 204, 205, and 206. Contact segments 302A and 302B are formed over the source regions of fins 203-206. Accordingly, contact segments 302C and 302D are formed over the drain regions of fins 203, 204, 205, and 206. As an example, contact segments 302A, 302B, 302C, and 302D may include via structures (sometimes referred to as via holes) filled with an electrically conductive material such as, for example, tungsten. Accordingly, conductive structure 309C is formed on gate structure 207 to allow the gate region of fins 203, 204, 205, and 206 to connect to other transistors (e.g., through conductive via 306C).

The drive current of transistor structure 300 may be controlled by enabling or disabling one or more fins in transistor structure 300. As shown in FIG. 3A, fin 203 may be disabled, if desired. In one scenario, gaps 303A and 303 are formed between the contact segments 302A and 302B, and 302C and 302D, in the respective source and drain regions to electrically isolate fin 203. Such a configuration may lower the drive current of transistor structure 300, as only three fins (fins 204, 205, and 206) are enabled. In another scenario, such a configuration may be bypassed by forming conductive structures 309A and 309B over gaps 303A and 303B, respectively. As shown in FIG. 3A, conductive structure 309A may electrically connect contact segment 302A to contact segment 302B in the source region of fins 203-206 and conductive structure 309B may electrically connect segment 302C to contact segment 302D in the drain region of fins 203-206. As such, all four fins are enabled and hence, a higher drive current may be achieved as compared to the previous scenario.

A more detailed description of the components in transistor structure 300 (e.g., contact segments 302A-302D, gaps 303A-303B, and conductive structure 309A-309C) will be described later with reference to FIG. 5B.

Figure 3B:
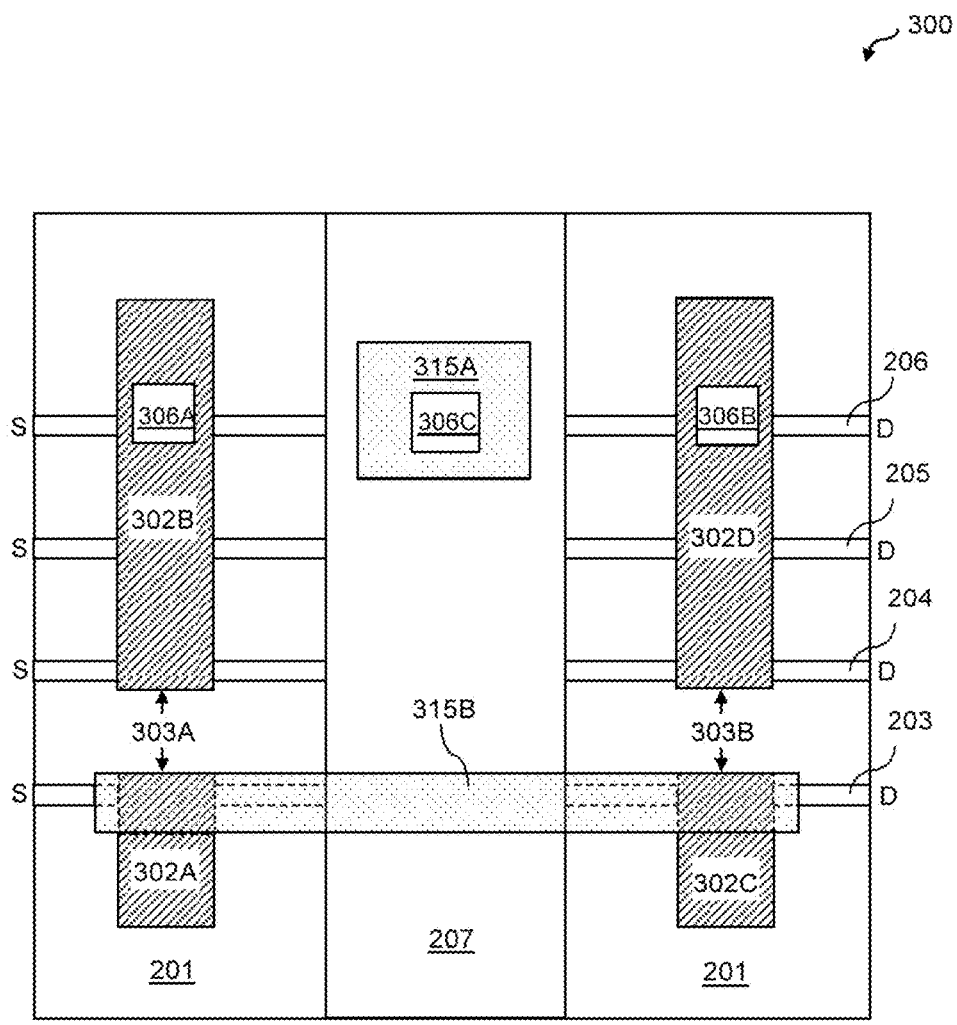
FIG. 3B shows a top view of an illustrative transistor structure having one disabled fin in accordance with an embodiment of the present invention.

FIG. 3B shows a top view of illustrative transistor structure 300 of FIG. 3A having one disabled fin (e.g., fin 203) in accordance with an embodiment of the present invention. It should be appreciated that for the sake of brevity, components already shown a described above with reference to FIG. 3A (e.g., oxide layer 201, gate structure 207, conductive structure 309B, etc.) will not be repeated.

As shown in FIG. 3B, fin 203 is isolated from fins 204-206 by forming a gap (e.g., gap 303A) between contact segments 302A and 302B in the source regions (denoted by "S") and another gap (e.g., gap 303B) between contact segments 302C and 302D segments in the drain regions (denoted by "D"). In one embodiment, the purpose of gaps 303A and 303B is to electrically isolate fin 203 from fins 204, 205 and 206.

In one embodiment, fin 203 may be disabled by changing just one mask used in device fabrication to select only three fins (e.g., fins 204, 205, and 206), which may reduce the cost and complexity associated with creating devices with a specific number of fins based on drive current. For example, conductive structures 315A and 315B are formed through the change of the mask that is employed in forming conductive structures 309A, 309B, and 309C of FIG. 3A via conventional photolithography and deposition techniques. As shown in FIG. 3B, conductive structure 315A is formed on gate structure 207 so that the gate region of fins 204-206 may be connected to other metal layers or transistors (e.g., through conductive via 306C). Such a configuration allows gate structure 207 to connect to other metal layers or transistors through conductive via 306C.

To disable fin 203 in transistor structure contact segment 302A, contact segment 302C, and the gate region of fin 203 are electrically connected (e.g., shorted) via conductive structure 315B. Such a configuration may also prevent fin 203 from floating, which may cause unpredictable charging or discharging impact to adjacent circuits (not shown) when transistor structure 300 is operating at a high frequency condition. With fin 203 disabled, the drive current of transistor structure 300 may be modulated with the remaining three active fins (e.g., fins 204, 205, and 206).

Figure 4:
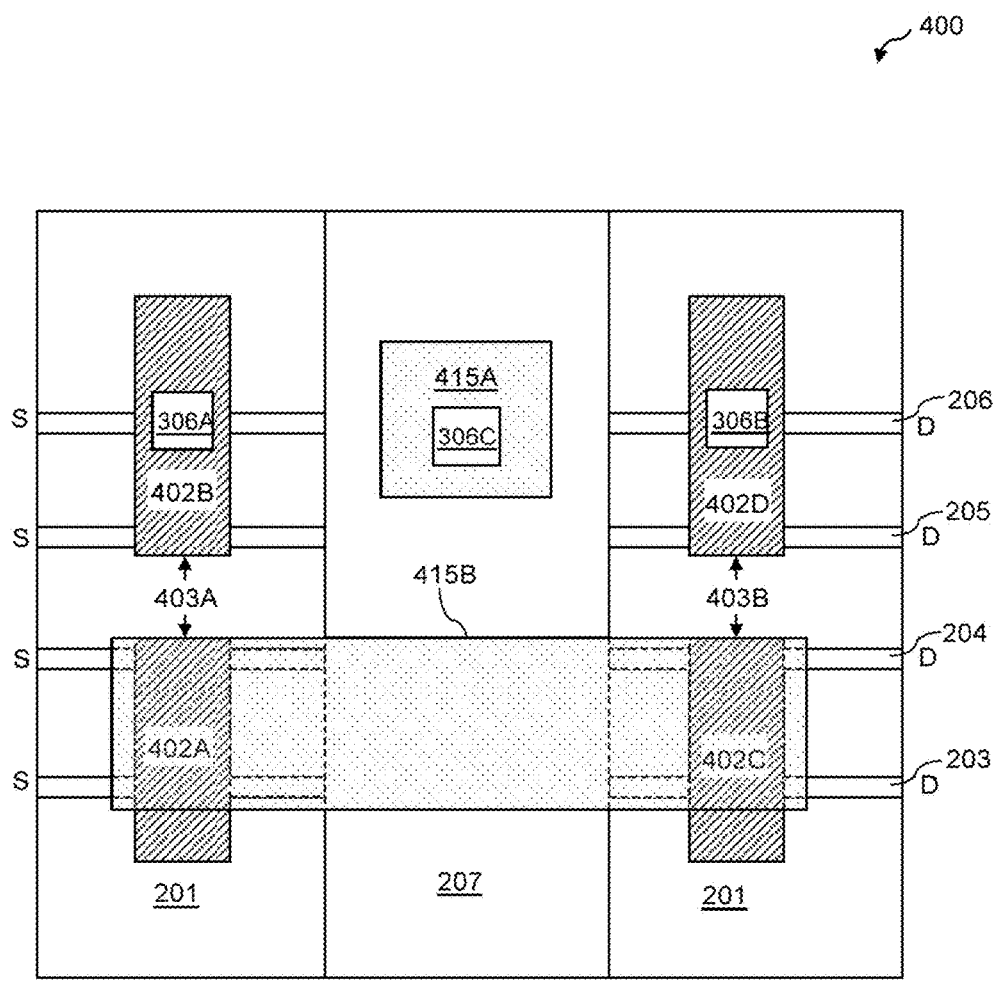
FIG. 4 shows a top view of an illustrative transistor structure having two disabled fins in accordance with an embodiment of the present invention.

In some scenarios, transistor structures having more than one disabled fin may be provided to modulate drive currents. FIG. 4 shows a top view of illustrative transistor structure 400 having two disabled fins (e.g., fins 203 and 204) in accordance with an embodiment of the present invention. It should be appreciated that the general strut of transistor structure 400 may be embodied as transistor structure 200 of FIG. 2, which is described above. As such, for the sake of brevity, elements that have been described above, such as fins 203, 204, 205, and 206, oxide layer 201, and gate structure 207, will not be described in detail.

As shown in FIG. 4, contact segments 402A, 402B, 402C, and 402D are vertically connected to fins 203, 204, 205, and 206. Contact segments 402A and 402B are formed over the respective source regions (as denoted by "S") of fins 203 and 204, and 205 and 206, whereas contact segments 402C and 402D are formed over the drain regions (as denoted by "D") of the respective fins 203 and 204, and 205 and 206. In one embodiment, contact segments 308A, 308B, 308C, and 308D are intermediate contact layers that connect the source and drain regions of fins 203, 204, 205, and 206 to other metal layers or transistors (not shown) through conductive vias 306.

Prior to disabling the targeted fins (e.g., fins 203 and 204), gaps are formed between the contact segments in the source and drain regions so that fins 203 and 204 may be electrically isolated from fins 205 and 206, and other metal layers or transistors. As shown in FIG. 4, gap 403A is formed between contact segments 402A and 402B in the source regions of fins 203-206 and gap 403B is formed between contact segments 402C and 402D in the drain regions of fins 203-206.

Fins 203 and 204 in transistor structure 400 may be disabled in a manner similar to that described above with reference to fin 203 of transistor structure 300 of FIG. 3B. By changing one single mask in device fabrication that results a specific number of fins to be selected, two different devices with different conductive structures (e.g., conductive structures 415A and 415B) in transistor structure 300 may be created.

As shown in FIG. 4, conductive structure 415A is formed on the gate regions of active fins (e.g., fins 205 and 206) in transistor structure 400. It should be appreciated that the configuration and functionality of conductive structure 415A may be the same as conductive structure 315A of FIGS. 3A and 3B, and thus, will not be described again herein. As shown in FIG. 4, conductive structure 415B may connect contact segment 402A, contact segment 402C and the gate portion of fins 203 and 204 in gate structure 207. Such a configuration allows fins 203 and 204 to be electrically connected (e.g., shorted) to their source, drain and gate regions and hence, disabling fins 203 and 204 from functioning in transistor structure 400. As such, the drive current of transistor structure 400 can be modulated with the remaining two active fins (e.g., fins 205 and 206).

In general, the drive current of a transistor structure may be directly proportional to the number of fins in the transistor structure. In an exemplary embodiment, the drive current of transistor structure 400 is lower in comparison with the drive current of transistor structure 300 of FIGS. 3A and 3B. This is because transistor structure 400 has only two active fins (e.g., fins 205 and 206) whereas transistor structure 300 of FIG. 3A has four active fins (e.g., fins 203, 204, 205, and 206) and transistor structure 300 of FIG. 3B has three active fins (e.g., fins 204, 205, and 206).

In another embodiment, the drive current of transistor structure 400 may be adjusted (e.g., maximized) by changing the one single mask to select a different number of fins in device fabrication. Similar to conductive structures 303A and 303B of FIG. 3A, a new set of conductive structures (not shown) may be formed over gaps 403A and 403B, respectively, so that they can electrically connect contact segment 402A to contact segment 402B in the source region of fins 203-206 and contact segment 402C to contact segment 402D in the drain region of fins 203-206. As such, all four fins 203-206 are selected (e.g., enabled) for use and hence, a higher drive current may be achieved as compared to when only two fins are enabled in transistor structure 400.

Figure 5:
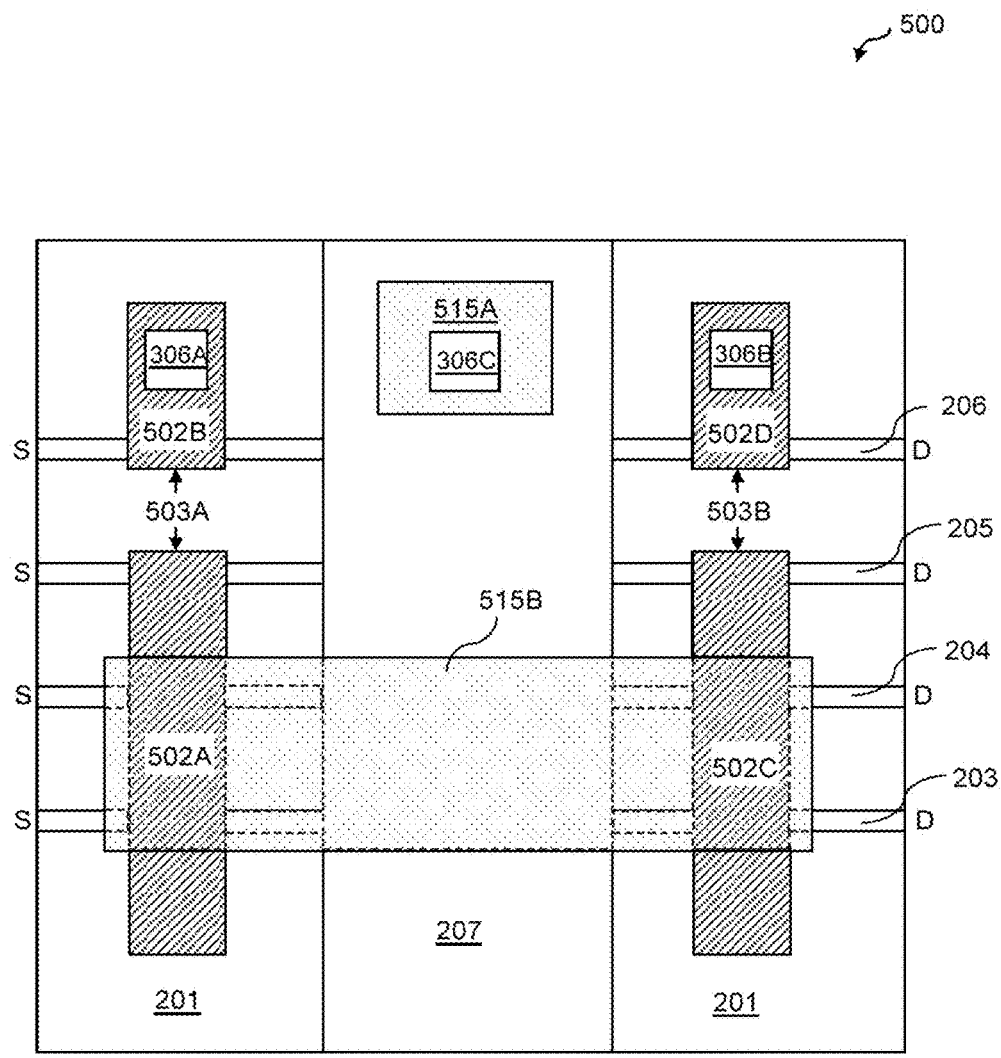
FIG. 5 shows a top view of an illustrative transistor structure having three disabled fins in accordance with an embodiment of the present invention.

FIG. 5 shows a top view of illustrative transistor structure 500 having three disabled fins (e.g., fins 203, 204, and 205) in accordance with an embodiment of the present invention. It should be appreciated that the general structure of transistor structure 500 may be embodied as transistor structure 200 of FIG. 2, which is described above. As such, for the sake of brevity, elements that have been described above, such as fins 203-206, oxide layer 201, substrate 202, and gate structure 207, will not be shown or described in detail.

In one embodiment, the use of three fins (e.g., fins 203, 204, and 205) in transistor structure 500 may be disabled by changing a mask in device fabrication that only selects fin 206 to be in used. It should be noted that during a photolithographic process, the pattern on the mask may be imprinted on a mask layer on transistor structure 500, which is used to form conductive structure 515A and 515B. The fabrication of conductive structure 515A and 515B may use a conventional manufacturing method, and therefore, is described in detail in order to not unnecessarily obscure the present invention. As shown in FIG. 5, conductive structure 515A is formed on the gate region of the active fin (e.g., fin 206) in the transistor structure. It should be appreciated that the configuration and functionality of conductive structure 515A may be similar to conductive structure 315A of FIGS. 3A and 3B, and thus, will not be described again herein.

Accordingly, conductive structure 515B may be formed to connect contact segment 502A to contact segment 502C. Prior to the connection of contact segment 502A and contact segment 502C, one gap (e.g., gap 503A) may be formed between contact segments 502A and 502B in the source regions of fins 203, 204, 205, and 206 and another gap (e.g., gap 503B) may be formed between contact segments 402C and 402D in the drain regions of 203, 204, 205, and 206. The purpose of these gaps is to isolate fins 203, 204, and 205 from making electrical connections to other metal layers or transistors (not shown) through conductive via 306C.

To disable fins 203, 204, and 205 in transistor structure 500, the source, drain, and gate regions of these three fins are electrically connected (e.g., shorted). Such a configuration also prevents fins 203, 204, and 205 from floating. As such, the drive current of transistor structure 500 may be modulated with the remaining one active fin (e.g., fin 206).

During device fabrication, a same set of masks may be used during device fabrication to create one or more finFET devices. In one embodiment, different device structures having different drive currents can be created by changing just one mask used in device fabrication that results a desired number of fins to be selected to modify the drive currents. For example, transistor structure 300 of FIGS. 3A and 3B, transistor structure 400 of FIG. 4, and transistor structure 500 of FIG. 5 may have different drive currents, respectively. In general, the drive current of a finFET device is directly proportional to the number of fins of the device. This means that when the number of active fins in a transistor device decreases, the width of the channel region between the source and drain regions will be reduced hence, lowering the drive current of the transistor device. For example, the drive current of transistor structure 500 is lower in comparison with the drive current of transistor structure 300 of FIG. 3B and the drive current of transistor structure 400 of FIG. 4. This is because transistor structure 500 has only one active fin (e.g., fin 206) whereas transistor structure 400 of FIG. 4 has two active fins (e.g., fins 205 and 206) and transistor structure 300 of FIG. 3B has three active fins (e.g., fins 204, 205, and 206).

Figure 6:
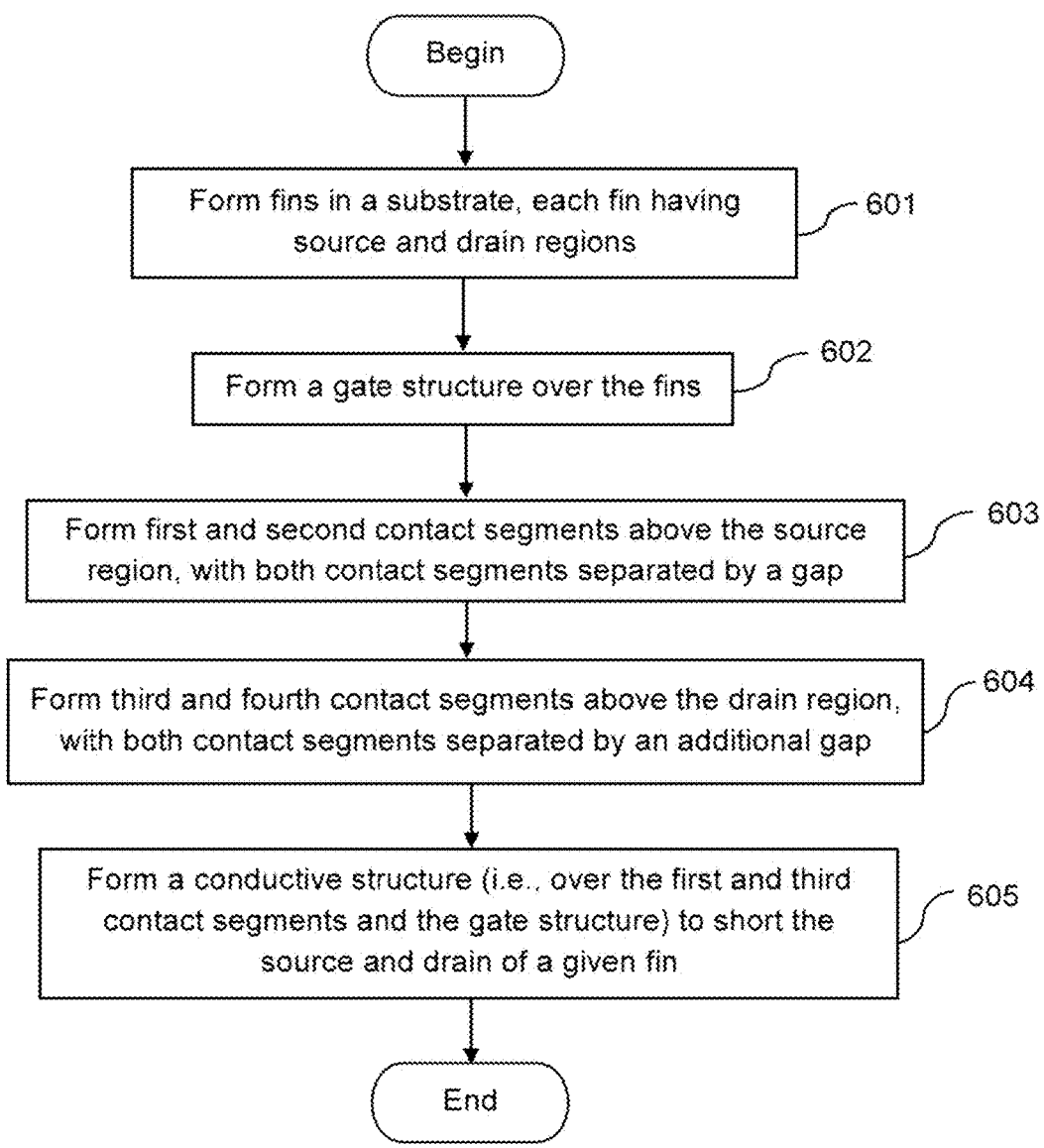
FIG. 6 shows an illustrative flowchart to fabricate a transistor structure on a substrate in accordance with one embodiment of the present invention.

FIG. 6 shows an illustrative flowchart to fabricate a transistor structure (e.g., transistor structure 300 of FIGS. 3A and 3B, transistor structure 400 of FIG. 4, and transistor structure 500 of FIG. 5) on a substrate (e.g., substrate 202 of FIG. 2) in accordance with one embodiment of the present invention. As step 601, multiple fins are formed in the substrate. Each fin may have source and drain regions. As shown in FIG. 2, fins 203, 204, 205, and 206 are partially formed in oxide layer 201 that is formed over substrate 202. The source and drain regions of fins 203, 204, 205, and 206 are denoted by "S" and "D", respectively.

At step 602, a gate structure is formed over the fins. For example, as shown in FIG. 2, gate structure 207 is formed between the source and drain regions of fins 203, 204, 205, and 206. Gate structure 207 may be used to control transistor structure 200 by applying an adequate voltage to the gate structure to generate an electric field that in turn creates a conductive path in an underlying channel region in between the source and drain regions.

At step 603, first and second contact segments are formed above the source region, with both contact segments separated by a gap. As shown in FIGS. 3A and 3B, contact segments 302A and 302B are formed above the source regions of fins 203, 204, 205, and 206 and separated by gap 303A. In one embodiment, contact segments 302A and 302B are part of an intermediate contact layer that connects the source regions to other metal layers or transistors (not shown).

At step 604, third and fourth contact segments are formed above the drain region, with both contact segments separated by an additional gap. As shown in FIGS. 3A and 3B, contact segments 302C and 302D are formed above the drain regions of fins 203, 204, 205, and 206 and separated by gap 303B. In one embodiment, contact segments 302C and 302D are part of another intermediate contact layer that connects the drain regions to the other metal layers.

In practice, one or more steps involving the same integrated components may be combined with other steps, performed in any suitable order, performed in parallel (e.g., simultaneously or substantially simultaneously), or removed. For example, steps 603 and 604 involve contact segments and these steps may be combined and performed in parallel.

In general, the drive current of a transistor structure may be directly proportional to the number of fins in the transistor structure. To modulate the drive current, a conductive structure may be formed to short the source and drain regions of a given fin at step 605. In one embodiment, the use of one or more fins may be disabled so that the drive current of the transistor structure can be adjusted (e.g., minimized). As shown in FIG. 3B, gaps 303A and 303B are formed between the contact segments 302A and 302B, and 302C and 302D, in the respective source and drain regions (denoted by "S" and "D," respectively) to electrically isolate fin 203. Conductive structure 315B may electrically connect to the gate structure, source and drain regions of fin 203 such that the use of fin 203 is disabled from transistor structure 300. Such a configuration may also prevent fin 203 from floating, which may cause unpredictable charging or discharging impact to adjacent circuits (not shown) when transistor structure 300 is operating at a high frequency condition.

The method and apparatus described herein may be incorporated into any suitable circuit. For example, the method and apparatus may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. A method of fabricating a transistor structure, comprising:
   providing a substrate;
   forming a plurality of fins on the substrate, wherein the plurality of fins includes at least one enabled fin and at least one disabled fin, and the at least one enabled fin and the at least one disabled fin each include a first source-drain region and a second source-drain region separated by a channel region;
   forming an integral gate structure over the respective channel regions of the at least one enabled fin and the at least one disabled fin;
   forming a first conductive structure above the plurality of fins, wherein the first conductive structure is shorted to the first source-drain region of the at least one disabled fin; and
   forming a second conductive structure above the plurality of fins, wherein the second conductive structure is shorted to the first source-drain region of the at least one enabled fin, and the first and second conductive structures are separated by a gap.

2. The method defined in claim 1, further comprising:
   forming first and second contact segments above the plurality of fins, wherein the first and second contact segments are separated by an additional gap, and wherein the first contact segment is in contact with the first conductive structure.

3. The method defined in claim 2, further comprising:
   forming third and fourth contact segments above the plurality of fins, wherein the third and fourth contact segments are separated by another gap, and wherein the third contact segment is in contact with the second conductive structure.

4. The method defined in claim 1 wherein each of the plurality of fins comprises a channel region.

5. Circuitry fabricated on a semiconductor substrate, comprising:
   a plurality of fins, wherein each fin has first and second fin portions in the semiconductor substrate, wherein the first and second fin portions of each fin are formed from respective first and second opposing ends on that fin;
   an integral gate structure disposed over each fin in the plurality of fins and in between the first and second fin portions of each fin in the plurality of fins;
   a first contact segment that is shorted to at least one of the first fin portions of the plurality of fins and that is physically separated from at least one other of the first fin portions of the plurality of fins; and
   a second contact segment that is shorted to at least one of the second fin portions of the plurality of fins and that is physically separated from at least one other of the second fin portions of the plurality of fins, wherein the integral gate structure is interposed between the first and second contact segments.

6. The circuitry defined in claim 5, further comprising:
   a conductive structure that electrically shorts the first contact segment to the second contact segment.

7. The circuitry defined in claim 6, further comprising:
   a channel region in between the first and second fin portions of the plurality of fins.

8. The circuitry defined in claim 7, wherein the integral gate structure is formed over the channel region.

9. The circuitry defined in claim 8, wherein the first contact segment is coupled to a source region of the circuitry, and wherein the second contact segment is coupled to a drain region of the circuitry.

10. The circuitry defined in claim 5 further comprising:
    a third contact segment shorted to the at least one of the first fin portions of the plurality of fins that is electrically isolated from the first contact segment, wherein the third contact segment is separated from the first contact segment by a first gap; and
    a fourth contact segment shorted to the at least one of the second fin portions of the plurality of fins that is electrically isolated from the second contact segment, wherein the fourth contact segment is separated from the second contact segment by a second gap.

11. The circuitry defined in claim 5 wherein the plurality of fins is partially formed in an oxide layer that is formed over the semiconductor substrate.

12. A transistor device comprising:
    a substrate;
    a plurality of fins that is formed on the substrate and that includes at least one enabled fin and at least one disabled fin, wherein the at least one enabled fin and the at least one disabled fin each include a first source-drain region and a second source-drain region separated by a channel region;
    an integral gate structure formed over the respective channel regions of the at least one enabled fin and the at least one disabled fin;
    a first conductive structure that is formed above the plurality of fins and that is shorted to the first source-drain region of the at least one disabled fin; and
    a second conductive structure that is formed above the plurality of fins and that is shorted to the first source-drain region of the at least one enabled fin, wherein the first and second conductive structures are separated by a gap.

13. The transistor device defined in claim 12, wherein the at least one enabled fin allows current to pass through the at least one enabled fin, and wherein the at least one disabled fin prevents current from passing through the at least one disabled fin.

14. The transistor device defined in claim 12, wherein each of the plurality of fins comprises a drain region and a source region, and wherein the source and drain regions are separated by a channel region.

15. The transistor device defined in claim 14, wherein the plurality of fins is coupled to the integral gate structure, and wherein the integral gate structure is formed directly over the channel region.

16. The transistor device defined in claim 12, wherein the plurality of fins is partially formed in an oxide layer that is formed over the substrate.

17. The circuitry defined in claim 5, wherein the first contact segment is coupled to a source region of the circuitry, and wherein the second contact segment is coupled to a drain region of the circuitry.

18. The transistor device defined in claim 12, wherein the at least one disabled fin includes a source portion and a drain portion and wherein the conductive structure shorts the source and drain portions.

19. The transistor device defined in claim 12, further comprising:
    a third conductive structure that is formed above the plurality of fins and that is shorted to the second source-drain region of the at least one disabled fin; and a fourth conductive structure that is formed above the plurality of fins and that is shorted to the second source-drain region of the at least one enabled fin, wherein the third and fourth conductive structures are separated by an additional gap and wherein the integral gate structure is interposed between the first and third conductive structures and between the second and fourth conductive structures.

20. The transistor device defined in claim 12, wherein the gap spans at least a portion of a distance between first and second adjacent fins in the plurality of fins.

\* \* \* \* \*